(12) United States Patent
Jiang et al.

(10) Patent No.: US 9,243,326 B2
(45) Date of Patent: Jan. 26, 2016

(54) SURFACE TREATMENT APPARATUS

(75) Inventors: Yu Yan Jiang, Nagoya (JP); Masahide Inagaki, Nagoya (JP); Kenji Nakashima, Nisshin (JP); Soichiro Makino, Nagakute (JP); Nariaki Horinouchi, Nisshin (JP); Takahiro Ito, Toyota (JP)

(73) Assignees: KABUSHIKI KAISHA TOYOTA CHUO KENKYUSHO, Nagakute (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 574 days.

(21) Appl. No.: 13/636,874

(22) PCT Filed: Mar. 17, 2011

(86) PCT No.: PCT/JP2011/057269
§ 371 (c)(1),
(2), (4) Date: Sep. 24, 2012

(87) PCT Pub. No.: WO2011/118742
PCT Pub. Date: Sep. 29, 2011

(65) Prior Publication Data
US 2013/0008610 A1     Jan. 10, 2013

(30) Foreign Application Priority Data
Mar. 26, 2010    (JP) .................................. 2010-071493

(51) Int. Cl.
*C23C 16/455*    (2006.01)
(52) U.S. Cl.
CPC ..... *C23C 16/45508* (2013.01); *C23C 16/45504* (2013.01); *C23C 16/45587* (2013.01); *C23C 16/45597* (2013.01)

(58) Field of Classification Search
CPC .................. C23C 16/45508; C23C 16/45504; C23C 16/45587; C23C 16/45591
See application file for complete search history.

(56) References Cited

U.S. PATENT DOCUMENTS 5,264,040 A  * 11/1993 Geyling .......................... 118/728
5,338,363 A     8/1994 Kawata et al.
(Continued)

FOREIGN PATENT DOCUMENTS

CN          1806325 A       7/2006
JP        A-05-166734        7/1993
(Continued)

OTHER PUBLICATIONS

Office Action issued in Chinese Application No. 201180016312.6 issued Dec. 12, 2013 (with translation).
(Continued)

*Primary Examiner* — Jeffrie R Lund
(74) *Attorney, Agent, or Firm* — Oliff PLC

(57) ABSTRACT

A surface treatment apparatus in which a disk-like sample-holding plate is provided inside an enclosure constituting a cylindrical circumferential wall. A cylindrical portion in an upper portion of the enclosure constitutes a material fluid supplying channel, and a channel provided on the lateral side of the sample-holding plate in the enclosure and shaped spreading as it goes farther from the cylindrical portion constitutes a fluid discharge channel. The fluid discharge channel employs a parabola curve or the like in which the position of the upper end of the outmost circumference of the sample-holding plate is defined as a focus position and the position of the upper end of the outlet that is symmetrically opposite to the focus position is defined as a reference position.

9 Claims, 6 Drawing Sheets

(56) References Cited

U.S. PATENT DOCUMENTS

| | | | |
|---|---|---|---|
| 6,059,885 A | 5/2000 | Ohashi et al. | |
| 6,113,705 A * | 9/2000 | Ohashi et al. | 118/730 |
| 6,143,077 A | 11/2000 | Ikeda et al. | |
| 6,197,121 B1 | 3/2001 | Gurary et al. | |
| 6,242,049 B1 | 6/2001 | McCarty et al. | |
| 2003/0150560 A1 * | 8/2003 | Kinnard | C23C 16/45504 156/345.33 |
| 2004/0200412 A1 * | 10/2004 | Frijlink | C23C 16/4412 118/715 |
| 2009/0142933 A1 | 6/2009 | Yajima et al. | |
| 2009/0238971 A1 | 9/2009 | Higashi et al. | |
| 2010/0183825 A1 * | 7/2010 | Becker | C23C 16/4404 427/569 |
| 2011/0114022 A1 * | 5/2011 | Boguslavskiy | C23C 16/45508 118/724 |
| 2011/0215071 A1 * | 9/2011 | Mitrovic et al. | 216/37 |
| 2011/0247556 A1 * | 10/2011 | Raring | C23C 16/45519 118/713 |
| 2011/0294283 A1 * | 12/2011 | Brien | C23C 16/45508 438/509 |
| 2013/0008610 A1 * | 1/2013 | Jiang | C23C 16/45508 156/345.55 |
| 2015/0030786 A1 * | 1/2015 | Coe | C23C 16/274 427/575 |

FOREIGN PATENT DOCUMENTS

| | | |
|---|---|---|
| JP | A-09-063966 | 3/1997 |
| JP | A-10-177959 | 6/1998 |
| JP | A-2001-110794 | 4/2001 |
| JP | A-2001-506803 | 5/2001 |
| JP | A-2002-016008 | 1/2002 |
| JP | A-2008-218734 | 9/2008 |
| JP | A-2009-135159 | 6/2009 |
| JP | A-2009-135229 | 6/2009 |
| JP | A-2009-135238 | 6/2009 |
| JP | A-2009-152521 | 7/2009 |
| JP | A-2009-260291 | 11/2009 |
| WO | WO 98/23788 | 6/1998 |
| WO | WO 03/035927 A2 | 5/2003 |
| WO | WO 2004/114398 A1 | 12/2004 |
| WO | WO 2009/049020 * | 4/2009 |

OTHER PUBLICATIONS

International Search Report issued in International Application No. PCT/JP2011/057269 dated Jun. 20, 2011.

International Preliminary Report on Patentability issued in International Application No. PCT/JP2011/057269 dated Sep. 14, 2012.

Office Action issued in Japanese Application No. 2010-071493 dated Aug. 13, 2013 (with translation).

Chinese Office Action issued in Chinese Application No. 201180016312.6 issued Jun. 10, 2014 (with translation).

Schlichting, *Boundary-Layer Theory*; Seventh Edition, 1979, pp. 102-104, USA.

Pollard et al., "Silicon Deposition on a Rotating Disk", *J. Electrochem. Soc.: Solid-State Science and Technology*, Mar. 1980, pp. 744-752, vol. 127, No. 3, USA.

* cited by examiner

SURFACE TREATMENT APPARATUS

TECHNICAL FIELD

The present invention relates to a surface treatment apparatus, and in particular, to a surface treatment apparatus in which a surface treatment material fluid flows along a surface of a substrate.

BACKGROUND ART

For example, for manufacturing semiconductor devices or the like, a material fluid, such as a suitable reactant gas, is supplied onto a substrate to form thereon a semiconductor layer, an insulating film, an electric conductive layer, or the like, or to etch or clean a surface thereof, or to form a coating member. Such a process, which has been widely employed also in fields other than semiconductor device manufacturing, can be referred to as surface treatment in a broad sense, and an apparatus for surface treatment can be referred to as a surface treatment apparatus in a broad sense.

For example, surface treatment apparatuses in a broad sense include an epitaxial apparatus for epitaxial growth of a semiconductor layer on a semiconductor wafer, an insulating wafer, or the like; a chemical vapor deposition (CVD) apparatus for depositing a thin film, such as a suitable oxide film or the like, on a semiconductor wafer; a dry-etching apparatus for removing a thin film or the like formed on a semiconductor wafer; and so forth.

The surface treatment apparatuses include a horizontal type in which a surface treatment material fluid is supplied in a direction in parallel to a surface of a substrate, and a vertical type in which a surface treatment material fluid is supplied in a direction substantially perpendicular to a surface of a substrate. In the latter, in order to ensure uniformity in surface treatment, the substrate is often rotated around an axis extending in the direction perpendicular to a surface of the substrate.

Such vertical-type rotary-surface treatment apparatuses are used for various uses, and have common features in the following points. That is, (1) a treatment target object having a treatment target surface of any of various shapes is placed in the middle of the apparatus and then rotated, (2) material gas or liquid is supplied from above the apparatus so that a boundary layer is formed near the surface of the treatment target object through rotation, (3) phase transition and chemical reaction is caused on the surface or in the boundary layer, whereby an effect of surface treatment is obtained, and (4) a fluid flows from the middle to an outside end portion of the treatment target object due to centrifugal force. As described above, in a vertical-type rotary surface treatment apparatus, a treatment target object is not necessarily a flat substrate, and a vertical-type rotary surface treatment apparatus can be used with a treatment target object of various shapes.

As described above, a feature of a vertical-type rotary surface treatment apparatus may include uniformity in distribution of physical parameters such as a boundary layer thickness, temperature, density, and so forth, in a boundary layer formed by rotating a treatment target object. Such uniform operation condition can lead to occurrence of uniform physical and chemical reactions on the surface, thus improving uniformity of products.

For example, Patent Document 1 describes that, in a CVD apparatus for forming an epitaxial growth layer on a surface of a semiconductor substrate, rotation of a wafer at a high speed such as a few hundreds of rotations per minute or faster causes a drop in the pressure near the wafer so that reactant gas supplied from above the wafer is drawn (pump effect) to the wafer surface, and, moreover, a boundary layer immediately above the wafer surface where epitaxial growth reaction is progressing is leveled to be thinner, to thereby improve efficiency in supplying reactant gas and thus the speed of epitaxial growth.

Regarding analysis on the pump effect, non-patent document 1 describes an example of an exact solution to the Navier-Stokes equation as to a flow around a disk rotating, in fluid around an axis perpendicular to a flat surface at a constant angular speed $\omega$. In the document, it is described that the thickness of the boundary layer can be approximated to $(\nu/\omega)^{1/2}$ in terms of as a kinematic viscosity coefficient $\nu$ of the fluid. And using normalization by a dimensionless distance $z/(\nu/\omega))^{1/2}$ where z is a distance along the axial direction, a 4-dimensional simultaneous partial differential equation, in terms of the speed u in the radial direction of the disk, the circumferential directional speed v, the axial directional speed w, and the pressure p, should be solved.

The calculation result shows that the axial directional speed w of the fluid due to the pump effect becomes smaller as the distance alone the axial direction becomes shorter while approaching the disk to become zero on a surface of the disk, and that the radial directional speed u shows a distribution in which the radial directional speed u is zero on a disk surface, then gradually increases with the distance along the axial direction, and returns to zero again as the distance becomes much longer.

Although the effect of temperature is not taken into consideration in non-patent document 1, non-patent document 2 describes that, as a technology for forming silicon on a rotating disk, solution of a 5-dimensional simultaneous partial differential equation with respect to a heat energy equation in consideration of heat conductivity of fluid, in addition to the 4-dimensional simultaneous partial differential equation described in non-patent document 1.

CITATION LIST

Patent Literature

Patent Literature 1: Japanese Patent Laid-open Publication No. Hei 9-63966

Non-Patent Literature

Non-Patent Literature 1: Dr. Hermann Schlichting (Translated by Dr. J. K. Kestin); Boundary-Layer Theory; Seventh Edition; USA; Mc Graw-Hill Book Company; 1979; p 102-104

Non-Patent Literature 2: Richard Pollard et. al.; Silicon Deposition on a Rotating Disk; J. Electrochem. Soc.; Solid-State Science and Technology; USA; March 1980; vol. 127, No. 3; p 744-745

SUMMARY OF THE INVENTION

Technical Problem

As described in patent document 1, in a vertical-type rotary surface treatment apparatus, a boundary layer is effectively formed due to the pump effect, and improvement in surface treatment uniformity and in productivity is expected. Further, with development of the content of the disclosure of the patent documents 1 and 2, further improvement of surface treatment uniformity can be expected.

Note that, in a vertical-type rotary surface treatment apparatus, the fluid used in reaction flows from the middle to an outside end portion of an object treated, due to centrifugal force. That is, an outlet channel for discharging a used fluid to the outside leads a flow that is in parallel to the surface of the object treated. Ideally, the parallel flow could be maintained when being led to the outside. However, due to the design or installation condition of the apparatus, there may often be a case in which the flow cannot be led in such a manner. In such a case, the outlet channel may be formed bent, and as a result, a flow of the used fluid may be disturbed as bumping against the inside wall of the outlet channel, and surface treatment components contained in the used fluid may cause reaction on the inside wall of the outlet channel. In an epitaxial apparatus or the like, for example, a semiconductor layer may be attached to and deposited on the inside wall of the outlet channel.

A similar problem may occur not only in an outlet channel of a vertical-type rotary surface treatment apparatus but also in an outlet channel of a horizontal-type surface treatment apparatus in which a surface treatment material fluid is supplied in a direction parallel to the surface of the substrate.

An object of the present invention is to provide a surface treatment apparatus capable of reducing turbulence of a flow due to a used fluid bumping against the inside wall of an outlet channel when a surface treatment material fluid flows along a substrate surface to be discharged.

Solution to the Problem

A surface treatment apparatus according to the present invention comprises an enclosure constituting a circumferential wall; a sample-holding plate provided inside the enclosure, for holding a sample; a material fluid supply channel provided to the enclosure, for supplying a material fluid to the sample on the sample holding plate; and a fluid discharge channel provided on a lateral side of the sample-holding plate in the enclosure, for discharging to the outside the material fluid having applied surface treatment to the sample while flowing along a surface of the sample, as a used fluid, via an outlet formed on the lateral side of the sample-holding plate, wherein when a directional axis perpendicular to a cross section of the outlet is defined as an x axis, a desired directional axis orthogonal to the x axis is defined as a y axis, a position of one of points where a circumferential end of the outlet intersects the y axis is defined as a focus position and also as a +a position of the y axis, a position of the other of the points where the circumferential end of the outlet intersects the y axis, being symmetrically opposite the focus position relative to the x axis is defined as a reference position and also as a zero position of the y axis, a reference line is defined in a −a position of the y axis, which is a position symmetrical to the focus position with the reference position in-between, a point where a desired normal line in parallel to the y-axis intersects the reference line is defined as a normal line upper end point, and a point where the desired normal line intersects a desired line extending from the focus position is defined as a normal line lower end point, the fluid discharge channel includes a channel one-side curved line that is a parabola curved line that passes the reference position formed by a trajectory of the normal line lower end point with a distance between the normal line upper end point and the normal line lower end point being equal to a distance between the focus position and the normal line lower end point, or a parabola analogous curved line formed with the parabola curved line as a basic curved line, and a channel other-side curved line opposite to the channel one-side curved line, and a shape of the fluid discharge channel is formed based on the channel one-side curved line and the channel other-side curved line.

Also, a surface treatment apparatus according to the present invention comprises an enclosure constituting a cylindrical circumferential wall; a sample-holding plate provided inside the enclosure, for holding a sample; a rotary mechanism for driving to rotate the sample-holding plate; a material fluid supply channel provided above the sample-holding plate in the enclosure, for supplying a material fluid to the sample on the sample-holding plate; and a fluid discharge channel provided on a lateral side of the sample-holding plate in the enclosure, for discharging the material fluid having being supplied as a vertical flow from above the sample-holding plate toward the sample and then having applied surface treatment to the sample while flowing along a surface of the sample, as a used fluid, via an outlet formed on the lateral side of the sample-holding plate, wherein when a directional axis perpendicular to a cross section of the outlet is defined as an x axis, a directional axis orthogonal to the x axis and in which the material fluid supplied from above the sample-holding plate toward the sample flows is defined as a y axis, a position of an upper end of an outmost circumference of the sample-holding plate, which is a lower end of the outlet, is defined as a focus position and also as a +a position of the y axis, a position of an upper end of the outlet that is symmetrically opposite the focus position relative to the x axis is defined as a reference position and also as a zero position of the y axis, a reference line is defined in a −a position of the y axis, which is a position symmetrical to the focus position with the reference position in-between, a point where a desired normal line in parallel to the y axis intersects the reference position is defined as a normal line upper end point, and a point where the desired normal line intersects a desired line extending from the focus position is defined as a normal line lower end point, the fluid discharge channel includes a channel one-side curved line that is a parabola curved line that passes the reference position formed by a trajectory of the normal line lower end point with a distance between the normal line upper end point and the normal line lower end point being equal to a distance between the focus position and the normal line lower end point, or a parabola analogous curved line formed with the parabola curved line as a basic curved line, and a channel other-side curved line opposite to the channel one-side curved line, and a shape of the fluid discharge channel is formed based on the channel one-side curved line and the channel other-side curved line.

Also, in a surface treatment apparatus according to the present invention, preferably, the fluid discharge channel may have the outlet having a height dimension equal to a thickness dimension of a boundary layer flowing on the surface of the sample.

Also, in a surface treatment apparatus according to the present invention, preferably, the fluid discharge channel may have an angled shape in the outlet formed on the lateral side of the sample-holding plate.

Also, in a surface treatment apparatus according to the present invention, when the sample-holding plate additionally has an outside member provided on an outside circumference side thereof, preferably, the outside member may constitute a channel other-side curved line including a top surface having a predetermined width and positioned lower than a height position of the sample-holding plate by a step and a smooth swollen shape extending further downward from the top surface, and the predetermined width may be defined so narrow that a flow being bent by the step into a direction in which the step portion is provided is prevented from flowing along the step and bumping against an opposite fluid discharge channel.

Also, in a surface treatment apparatus according to the present invention, preferably, the enclosure may have a cylindrical shape having a central axis in parallel to the y axis, and the fluid discharge channel may include a one-side channel surface in a circular symmetrical shape formed by rotating the channel one-side curved line around the central axis of the enclosure, an other-side channel surface in a circular symmetrical shape formed by rotating the channel other-side curved line around the central axis of the enclosure, and a connection surface for connecting the one-side channel surface and the other-side channel surface.

Advantageous Effects of the Invention

According to at least one of the above described structures, a surface treatment apparatus has a channel provided on the lateral side of the sample-holding plate in the enclosure, for discharging the material fluid having applied surface treatment to the sample while flowing along a surface of the sample, as a used fluid, via the outlet formed on the lateral side of the sample-holding plate to the outside. The shape of the fluid discharge channel is formed based on a channel curved line at one side (hereinafter referred to as a "channel one-side curved line") and a channel curved line at the other side (hereinafter referred to as a "channel other-side curved line") opposite to the channel one-side curved line, in which the position of one of the circumferential ends of the outlet is defined as a focused position, the position of the other of the same is defined as a reference position, and the channel one-side curved line passes the reference position.

The channel one-side curved line is defined as described below. That is, while a reference line is defined in a position symmetric to the focus position with the reference position in-between, the channel one-side curved line is formed by the trajectory of a point with a normal line perpendicular to the reference line, the length of which is equal to the length of a desired line extending from the focus position to the normal line. Such a curved line constitutes a parabola curve for use with a so-called collimation mirror in which incident waves coming from the focus position and hitting and thus being reflected by a curved line travel in parallel to the normal line. Therefore, a fluid flowing from the focus position at the circumferential end of the outlet and hitting and thus being reflected by the channel one-side curved line resultantly flows in flows that are parallel to each other. With the above, when a surface treatment material fluid flows along a substrate surface to be discharged, it is possible to reduce turbulence of the flow due to the used fluid bumping against the inside wall of the outlet channel.

According to at least one of the above described structures, a vertical-type rotary surface treatment apparatus has a fluid discharge channel for discharging the material fluid having been supplied from above the sample-holding plate as a vertical flow toward the sample and then having applied surface treatment to the sample while flowing along a surface of the sample, as a used fluid, via the outlet formed on the lateral side of the sample-holding plate. The shape of the fluid discharge channel is formed based on a channel one-side curved line and a channel other-side curved line opposite to the channel one-side curved line, in which the position of the upper end of the outmost circumference of the sample-holding unit, which is the lower end of the outlet, is defined as a focus position, the position of the upper end of the outlet is defined as a reference position, and the channel one-side curved line passes the reference position.

Note that the channel one-side curved line is formed as a parabola curved line for use with a so-called collimation mirror in which incident waves coming from the focus position and hitting and thus being reflected by a curved line travel in parallel to a normal line. Therefore, a fluid flowing from the focus position defined in the circumferential end of the outlet and hitting the channel one-side curved line resultantly flows in flows that are parallel to each other. With the above, when a surface treatment material fluid flows along a substrate surface to be discharged, it is possible to reduce turbulence of a flow caused due to the used fluid bumping against the inside wall of the outlet channel.

Also, in a surface treatment apparatus, the fluid discharge channel has an outlet whose height is equal in the dimension to the thickness of the boundary layer flowing on a sample surface. This makes it possible to define the outlet in the optimum minimum dimension.

Also, in a surface treatment apparatus, the fluid discharge channel has an angled portion in the outlet formed on the lateral side of the sample-holding plate. This can effectively prevent occurrence of a backflow flowing from the fluid discharge channel toward the sample-holding plate side.

Also, in a surface treatment apparatus, for a sample-holding plate additionally having an outside member provided on an outside circumference side thereof, the outside member includes a top surface having a predetermined width positioned lower than the height position of the sample-holding plate by a step and a smooth swollen shape extending downward from the top surface. The predetermined width is defined to be so narrow that a flow being bent by the step so as to flow into a direction in which the step is provided is prevented from flowing along the step and bumping against the opposite fluid discharge channel. As a result of being bent downward by the step, the used fluid can readily flow toward the gas discharge unit. With the step having a suitable width, it is possible to prevent a flow from bumping against the opposite fluid channel to ensure a flow flowing along the smooth swollen shape extending further downward from the top surface.

Also, in a surface treatment apparatus, preferably, the enclosure may have a cylindrical shape having a central axis in parallel to the y axis, and the fluid discharge channel may include a one-side channel surface in a circular symmetrical shape formed by rotating the channel one-side curved line around the central axis of the enclosure, an other-side channel surface in a circular symmetrical shape formed by rotating the channel other-side curved line around the central axis of the enclosure, and a connection surface for connecting the one-side channel surface and the other-side channel surface.

DESCRIPTION OF EMBODIMENTS

Figure 1:
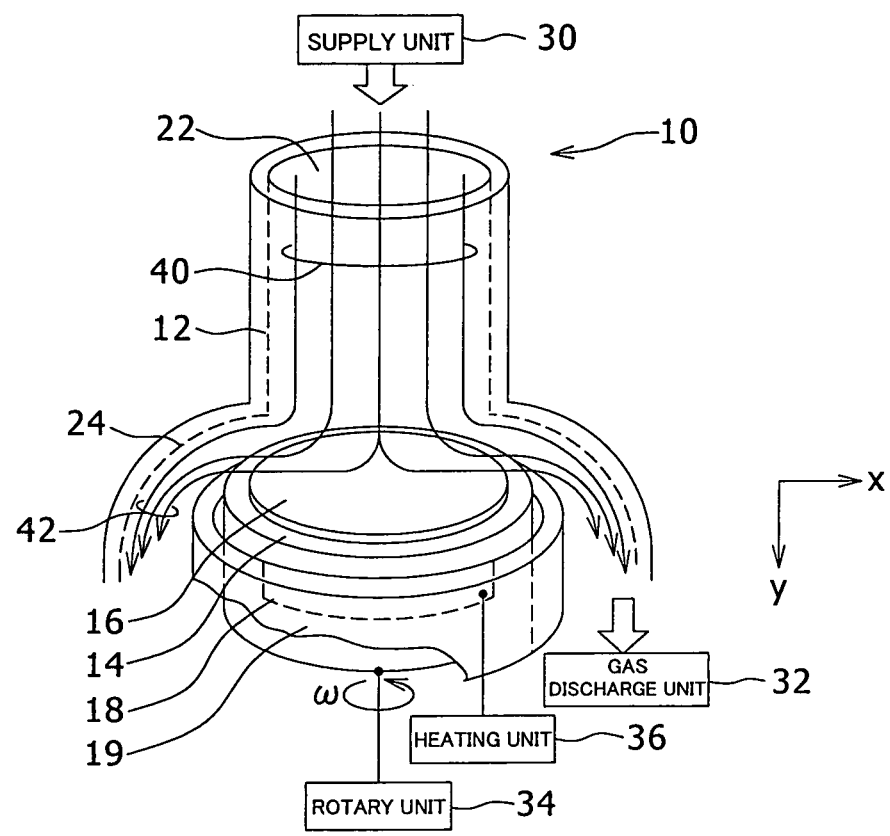
FIG. 1 is a diagram explaining a structure of a surface treatment apparatus according to an embodiment of the present invention.

In the following, an embodiment according to the present invention will be described in detail by reference to the accompanying drawings. In the following, as a surface treatment apparatus, there is described a vertical-type rotary surface treatment apparatus in which a surface treatment material fluid is supplied in a direction substantially perpendicular to a substrate rotating so as to thereafter flow along a surface of the substrate while applying surface treatment to the substrate. This, however, is only one example for illustration, and any surface treatment apparatus in which a surface treatment material fluid flows along a substrate surface is applicable. For example, a horizontal-type surface treatment apparatus in which a surface treatment material fluid is originally supplied along a substrate surface is applicable.

In the following, a downward shape is described as a shape of the fluid discharge channel in which a used fluid initially flows in parallel to a substrate and is then discharged downward. This shape is suitable for a vertical-type rotary surface treatment apparatus in which a material fluid is supplied from above the apparatus. Meanwhile, the fluid discharge channel of a horizontal-type surface treatment apparatus, for example, may have a shape other than the downward shape. For example, the fluid discharge channel may be so shaped that the flowing direction is changed on a plane in parallel to a substrate surface, and an upward shape for discharging a fluid upward may be employed for the fluid discharge channel when appropriate.

In the following, an epitaxial growth apparatus for silicon single crystal is described as an example of a surface treatment apparatus. This, however, is only an example, and a surface treatment apparatus in which a material fluid such as suitable reactant gas is supplied onto a substrate to form thereon a semiconductor layer, an insulating film, an electric conductive layer, or the like, or to etch or clean a surface thereof, or to form a coating member may be applicable.

In the following, for silicon single crystal growth, reactant gas that is a mixture of $SiHCl_3+H_2$ is referred to as a material fluid for surface treatment. This is a result of selection only for convenience of explanation of a surface treatment apparatus, and reactant gas of other kinds may be applicable, depending on the nature of surface treatment. Further, a material fluid such as other liquid is also applicable. For example, a spraying etching liquid, a resist liquid, or the like is usable. Further, in the following, silicon single crystal growth by heating a substrate is described. This, however, is only an example of surface treatment, and surface treatment of forming a film on a substrate by supplying a surface treatment material fluid onto a substrate rotating is applicable with or without heating the substrate.

Note that the material, dimension, shape, temperature, fluid amount, and so forth to be described below are only for illustration, and may be desirably changed depending on the nature of surface treatment. For example, although a wafer substrate is described as a surface treatment target, an object having an uneven shape is applicable.

In the following, like elements are assigned like reference numerals in all drawings with duplicated descriptions omitted. In the description, a reference numeral mentioned earlier may be referred to when necessary.

Figure 2:
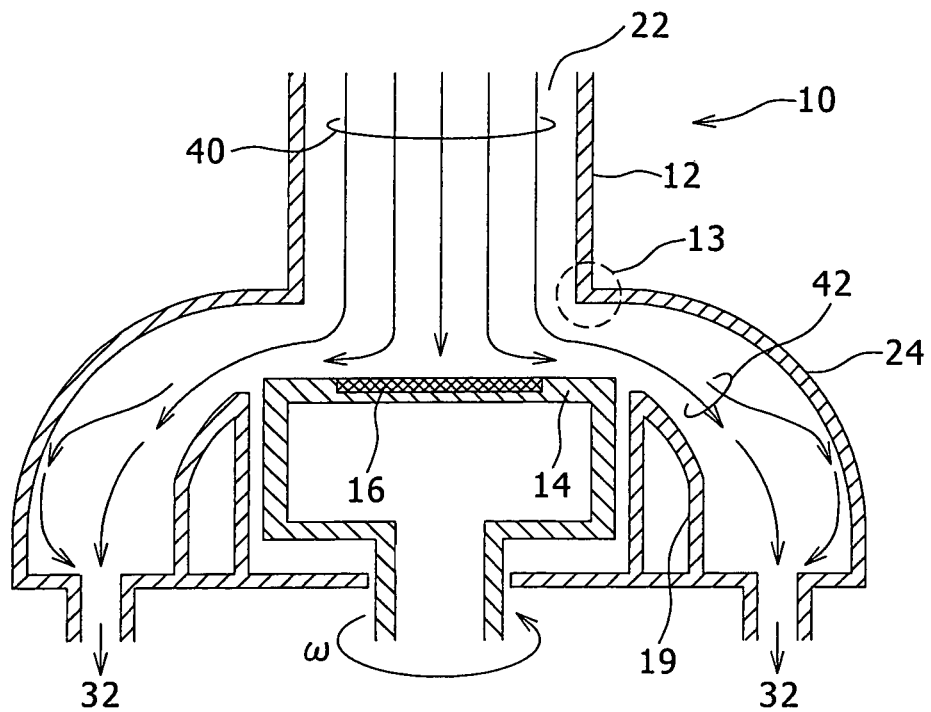
FIG. 2 is a cross sectional view of a surface treatment apparatus according to an embodiment of the present invention.

FIG. 1 is a diagram explaining the structure of a surface treatment apparatus 10. FIG. 2 is a cross sectional view of the surface treatment apparatus 10. The surface treatment apparatus 10 is a surface treatment apparatus of a type that supplies a surface treatment material fluid 40 to a rotating substrate 16 in a direction substantially perpendicular to the substrate 16 so that the surface treatment material fluid 40 thereafter flows along a surface of the substrate 16 while applying surface treatment, and is referred to as a so-called vertical-type rotary surface treatment apparatus. Specifically, the surface treatment apparatus 10 is an epitaxial apparatus in which a semiconductor layer is formed by means of epitaxial growth on a semiconductor wafer, an insulating wafer, or the like.

Note that, in FIG. 1, a directional axis in parallel to the direction in which the material fluid 40 flows is defined as the y axis, while a directional axis in parallel to the surface of the substrate 16 is defined as the x axis. Terms "above (up)" and "down (downward, lower)" used in the following description are defined such that the direction of the upstream of the flowing material fluid 40 along the y axis is defined as "above (up)" and that of the downstream is defined as "down (downward, lower)". In general, a direction from "above (up)" to "down (downward, lower)" is the direction of gravity.

The surface treatment apparatus 10 is an apparatus having an enclosure 12 constituting a cylindrical circumferential wall and a disk-like sample-holding plate 14 placed inside the enclosure 12. Note that the substrate 16, not a structural component of the surface treatment apparatus 10, is shown in FIG. 1 as a target of silicon single crystal epitaxial growth processing serving as surface treatment. A silicon wafer can be used as the substrate 16.

The enclosure 12 is a reaction vessel having a function of supplying material gas that serves as the material fluid 40 for surface treatment to the substrate 16, or a sample, on the sample-holding plate 14 while keeping the substrate 16 secluded from the outside, and further of leading the used fluid 42 to the outside.

A cylindrical portion 22 provided above the sample-holding plate 14 in the enclosure 12 constitutes a material fluid supplying channel for supplying the material fluid 40 to the substrate 16, or a sample, on the sample-holding plate 14.

A channel formed on the lateral side of the sample holding plate 14 in the enclosure 12 that has a shape spreading as it goes farther from the cylindrical portion 22 is a fluid discharge channel 24. The fluid discharge channel 24 is a channel having a function of discharging the material fluid 40 having been supplied as a vertical flow from above the sample-holding plate 14 toward the substrate 16, or the sample, and then having applied surface treatment to the substrate 16 while flowing along the surface of the substrate 16, as a used fluid 42 via an outlet formed on the lateral side of the sample-holding plate 14. Details, including the shape or the like, of the fluid discharge channel 24 are described later.

A supply unit 30 connected to the cylindrical portion 22 of the enclosure 12 is a gas-supplying device having a function of supplying reactant gas in a constant fluid amount as the material fluid 40 for silicon single crystal epitaxial growth processing with a constant pressure. As the reactant gas, a mixture gas of $SiHCl_3+H_2$ can be used.

A gas discharge unit 32 connected to the fluid discharge channel 24 of the enclosure 12 is a gas discharge device having a function of discharging to the outside the used fluid 42 having been led from the fluid discharge channel 24 after application of suitable discharge gas detoxification process to the used fluid 42. The gas discharge unit 32 can include a discharge pump or the like for readily leading used gas to the outside. As a discharge gas detoxification process, a dilution process can be employed. Further, a removal process or the like for removing toxic components contained in the used fluid 42 by means of precipitation reaction or the like can be employed.

The sample-holding plate 14 is a rotating body having a function of holding the substrate 16, or a sample targeted by surface treatment, and of rotating the substrate 16 while heating. The sample-holding plate 14 is a cylindrical covered member having a concave formed on a lower part thereof, a sample-holding mechanism formed on the upper surface thereof for rigidly holding the substrate 16, and a heater 18 placed inside the concave on the lower part thereof. As the sample-holding mechanism, a mechanism having a recess conforming with the outer shape of a wafer can be employed. In addition, there can be employed a mechanism for mechanically fixing a wafer on the outer circumference thereof or the like, a mechanism for fixing a wafer by means of vacuum suction, or the like. Note that while the sample-holding mechanism rotates together with the sample-holding plate 14, the heater 18 does not rotate.

A rotary unit 34 is a rotary mechanism having a function of driving to rotate the sample-holding plate 14 around a rotational central axis at a predetermined angular speed ω. The rotational central axis extends perpendicular to a surface of the sample-holding plate 14, being the central axis of the covered cylindrical shape. Further, the rotational central axis is preferably coaxial with the central axis of the cylindrical portion 22 of the enclosure 12. As the rotary unit 34, there can be comprising a motor and a power transmission mechanism for connecting the motor and the outside circumference of the covered cylindrical shape of the sample holding plate 14. As the power transmission mechanism, a gear mechanism, a belt mechanism, and so forth, can be employed.

A heating unit 36 is a heating control device for controlling turning on/off the heater 18 placed and held inside the sample-holding plate 14 to set the substrate 16 at a predetermined reaction temperature. Heating control can be performed based on data supplied from a temperature sensor for detecting the temperature of the heater 18.

A protection ring 19 provided around the outside circumference of the sample-holding plate 14 is an outside member having a function of protecting the outer circumference of the sample-holding plate 14 rotating. The protection ring 19 constitutes a part of the fluid discharge channel 24, as shown in FIG. 2, with the side wall on the outside circumferential side thereof constituting the inside wall on the inner side of the fluid discharge channel 24. That is, the used fluid 42 flows between the side wall of the protection ring 19 and the inside wall on the outer side of the fluid discharge channel 24 that spreads in the manner of an umbrella.

In the following, a shape or the like of the fluid discharge channel 24 will be described in detail. The fluid discharge channel 24 is a channel for leading the used fluid 42 to the gas discharge unit 32 via the outlet formed on the lateral side of the sample-holding plate 14, as described above. Therefore, the beginning on the upstream side of the fluid discharge channel 24 is the outlet formed on the lateral side of the sample-holding plate 14, and the end on the downstream side of the same is the connection port connected to the gas discharge unit 32.

The fluid discharge channel 24 corresponds to the lower portion of the enclosure 12, as shown in FIG. 1, and has a circular symmetrical shape that spreads almost like an umbrella or a skirt as it goes farther away from the cylindrical portion 22 on the upper portion of the enclosure 12. That is, the fluid discharge channel 24 is a spreading annular channel that extends from the annular outlet so as to surround the outside circumference of the covered cylindrical sample-holding plate 14 and the protection ring 19, passing a curved surface channel having a curved portion to be described below to be opened annularly downward, in which the annular outlet is opened in the circumferential direction over the entire circumference of the outside circumferential end of the sample-holding plate 14.

Note that the connection port to the gas discharge unit 32 is not necessarily annular. Instead, the end portion of the fluid discharge channel 24 may be formed as a closed annular shape with a hole formed on a part of the closed shape to be used as a connection port to the gas discharge unit 32.

The fluid discharge channel 24 is a channel having a function of letting the used fluid 42 flow inside thereof. The used fluid 42, which flows in the radial direction of the substrate 16 along the surface of the substrate 16, is a collection of flows flowing in various directions. The fluid discharge channel 24 is so shaped that the collection of flows flowing in various directions can flow in parallel to each other as much as possible so that turbulence of the flow can be reduced. The outer shape of the fluid discharge channel 24 is substantially like an umbrella, as described above, with a specific method of forming such a shape to be described later.

FIG. 2 is a cross sectional view of the surface treatment apparatus 10, as described above. As shown in FIG. 2, the enclosure 12 has the cylindrical portion 22 and the umbrella-like fluid discharge channel 24, in which a portion where the cylindrical portion 22 is connected to the umbrella-like fluid discharge channel 24 constitutes an angled portion 13. The space between the angled portion 13 and the sample-holding plate 14 corresponds to the outlet for a flow flowing in the radial direction of the substrate 16 along the surface of the substrate 16. While the sample-holding plate 14 is rotatable, the protection ring 19 is fixed relative to the enclosure 12.

Figure 3:
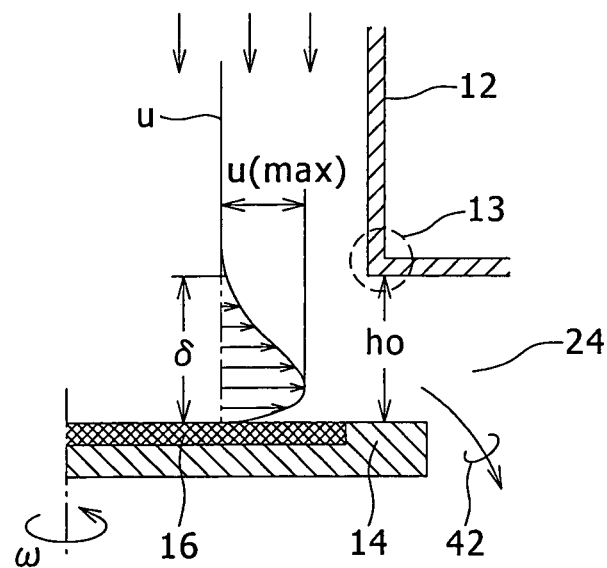
FIG. 3 is a diagram explaining a flow flowing toward a fluid discharge channel in a surface treatment apparatus according to an embodiment of the present invention.

FIG. 3 is a diagram explaining a flow flowing into the fluid discharge channel 24 in an area near the outlet. In the surface treatment apparatus 10, the material fluid 40 for surface treatment is supplied in a direction substantially perpendicular to the substrate 16 rotating so as to thereafter flow along a surface of the substrate 16 while applying surface treatment to the substrate 16, as described above. Therefore, the flow resultantly runs along the surface of the substrate 16 in an area near the outlet. FIG. 3 shows distribution, in the axial direction, of a radial directional speed u in an area near the outside circumferential end of the sample-holding plate 14 or substrate 16 under a condition set such that a flow having a thickness δ is formed. As shown in FIG. 3, the radial directional speed u has a maximum speed distribution u (max) in which the radial directional speed u is zero on the surface of the substrate 16, then gradually increases with the distance z going farther away from the substrate 16, and returns to zero as the distance z becomes much longer as going yet farther away from the substrate 16.

As described above, a radial directional speed is present in an area near the surface of the substrate 16, the area having a certain width up from the surface of the substrate 16 in the axial direction. In other words, in an area having a certain height in the axial direction up from the surface of the substrate 16, the used fluid 42 flows from the outside circumferential end of the substrate 16 in the radial direction. The maximum speed of the flowing used fluid 42 is defined as the maximum speed u(max). In FIG. 3, the range of the height of an area along the axial direction where a flow flows in the radial direction is defined as $h_0$, and the height $h_0$ can be defined as the height of the inlet of the fluid discharge channel 24. That is, δ as the thickness of the boundary layer that is defined with an appropriate threshold speed set can be used as the height $h_0$.

In the following, there will be described the shape; in particular, the outer shape that spreads like an umbrella, of the fluid discharge channel 24 that is suitable to smoothly lead a flow flowing from the outlet to the gas discharge unit 32, as described above. As described above, the fluid discharge channel 24 is so shaped that collection of flows flowing in various directions can flow in parallel to one another as much as possible so that turbulence of the flows can be reduced. As a shape of the channel capable of forming such a flow, a circular symmetrical shape based on a parabola curve can be employed.

Figure 4:
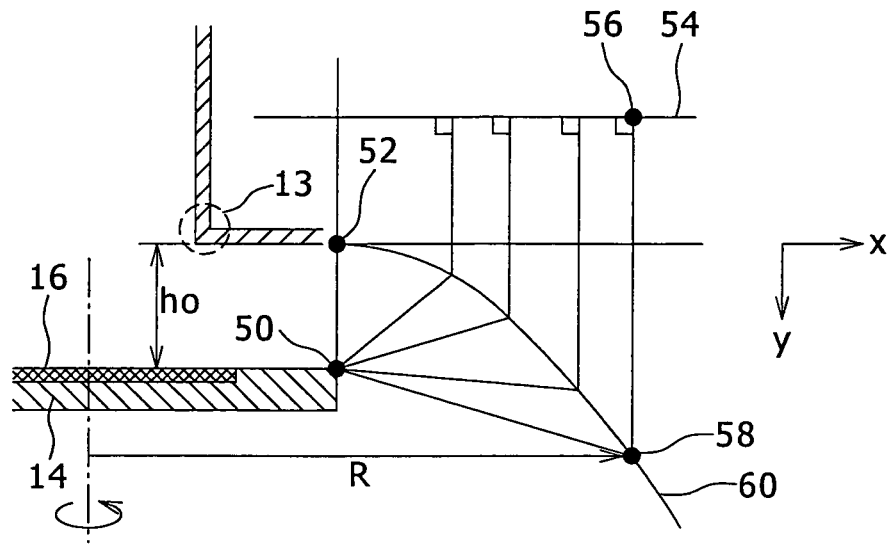
FIG. 4 is a diagram explaining an idea for formation of the shape of the fluid discharge channel in an embodiment of the present invention.

A parabola curve is a curved line used in a so-called collimation mirror, in which when an incident wave coming from a focus position hits and is reflected on a curved line, any reflected waves travel in parallel to a normal line. FIG. 4 is a diagram explaining the principle related to a structure in which the fluid discharge channel 24 is shaped using a parabola curve 60. Note that the x and y axes shown in FIG. 4 are the same as those described with reference to FIG. 1. It is assumed here that the outside circumferential end of the sample-holding plate 14 is defined as the focus position 50 of the parabola curve 60, and that a position apart up from the top surface of the sample-holding plate 14 by the height $h_0$ of the outlet, described by reference to FIG. 3, is defined as a reference position, or the start position of the parabola curve 60.

In this case, the parabola curve 60 can be obtained as a trajectory of a point characterized that the length of a line normal from this point to a reference line 54 is equal to the length a line from this point to the focus position 50, in which the reference line 54 is defined apart up from the top surface of the sample-holding plate 14 by the distance $2h_0$. With the thus-obtained parabola curve 60, when a flow coming from the focus position 50, corresponding to the incident wave, hits and thus is reflected on the curved line, any resultant flow, corresponding to the reflected wave, travels in parallel to a line normal to the reference line 54 due to the characteristics of the parabola curve 60, as described above. That is, with use of the parabola curve 60 as the shape of the fluid discharge channel 24, any flows flowing horizontally from the outside circumferential end of the sample-holding plate 14 can be directed in the y direction to be parallel to one another without intersection.

Figure 5:
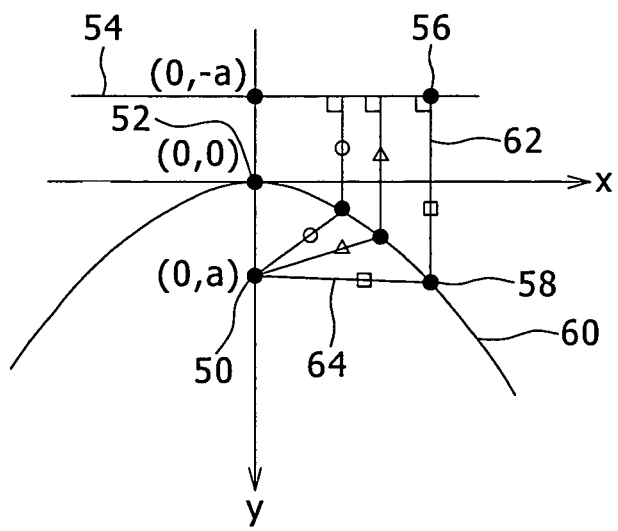
FIG. 5 is a diagram explaining a parabola curve for use as a curved line of the fluid discharge channel in an embodiment of the present invention.

FIG. 5 is a diagram explaining the parabola curve 60, in which the x and y axes shown are orthogonal axes used in explanation of the parabola curve 60, for which the x and y axes described with reference to FIG. 1 can be used intact. The focus position 50 is expressed as (0, a) in xy coordinates, and the vertex of the parabola curve 60, which can be defined as a reference position 52, is expressed as (0, 0) in xy coordinates. In order to obtain the parabola curve 60, the reference line 54 is necessary. The reference line 54 is a line in parallel to the x axis, passing a point (0,−a) that is symmetric to the focus position 50 with the reference position 52 in-between.

Assuming that a point where a desired normal line 62 in parallel to the y axis intersects the reference line 54 is defined as an upper end point 56 of the normal line (hereinafter referred to as a normal line upper end point 56) and a point where the desired normal line 62 intersects a desired line 64 extending from the focus position 50 is defined as a lower end point 58 of a normal line (hereinafter referred to as a normal line lower end point 58), the parabola curve 60 is given as a trajectory of the normal line lower end point 58 with the normal line 62 whose length, corresponding to the distance between the normal line upper end point 56 and the normal line lower end point 58, is equal to the length of the desired line 64, corresponding to the distance between the focus position 50 and the normal line lower end point 58.

A mathematical explanation is as follows. That is, assuming that the position of the normal line lower end point 58 on the parabola curve 60 is generally expressed as (x, y), the length of the normal line 62 is equal to the length of the desired line 64. The length of the normal line 62 is given as (y+a), and the length of the desired line 64 is given as $\{x^2+(a-y)^2\}^{1/2}$. When these two are equal to each other, $x^2=4ay$ holds. This is an expression of a parabolic curve.

Figure 6:
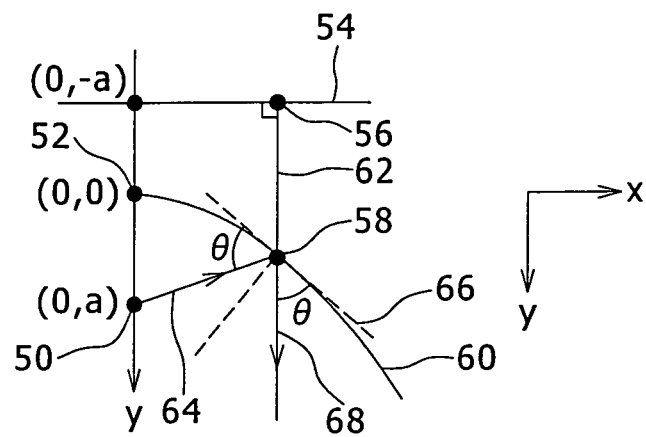
FIG. 6 is a diagram explaining formation of a parabola curve for use as a curved line of the fluid discharge channel in an embodiment of the present invention.

FIG. 6 is a diagram explaining application of the parabola curve 60 shown in FIG. 5 to the fluid discharge channel 24. In order to apply the parabola curve 60 to the fluid discharge channel 24, the directional axis perpendicular to the cross section of the outlet is defined as the x axis, while the directional axis orthogonal to the x axis and extending in a direction in which a material fluid supplied from above the sample-holding plate 14 toward the substrate 16 flows is defined as the y axis. The setting of the x and y axes is as described with reference to FIG. 1. Further, the position of the upper end of the outermost circumference of the sample-holding plate 14, or the lower end of the outlet, is defined as the focus position 50 and expressed as (0, a) in xy coordinates, and the position of the upper end of the outlet, which is symmetrically opposite to the focus position 50 relative to the x axis, is defined as the reference position 52 and expressed as (0, 0) in xy coordinates.

That is, the upper end of the outlet, or an opening defined on the lateral side of the outmost circumference of the sample-holding plate 14, corresponds to the reference position 52, and the lower end of the same corresponds to the focus position 50. In other words, the distance a between the focus position 50 and the reference position 52 corresponds to the length of the opening in the y direction. That is, the height $h_0$, described with reference to FIG. 3, can be used as the distance a.

Further, the reference line 54 in parallel to the x axis and virtually passing the point (0,−a) is defined; a point where the desired normal line 62 in parallel to the y axis intersects the reference line 54 is defined as the normal line upper end point 56 and a point where the desired normal line 62 intersects the desired line 64 extending from the focus position 50 is defined as the normal line lower end point 58, as described with reference to FIG. 5; and there is obtained the trajectory of the normal line lower end point 58 with the normal line 62 whose length, corresponding to the distance between the normal line upper end point 56 and the normal line lower end point 58, is equal to the length of the desired line 64, corresponding to the distance between the focus position 50 and the normal line lower end point 58. The obtained trajectory constitutes the parabola curve 60.

The effect of the parabola curve 60 is such that the angle formed by a tangent line 66 of the parabola curve 60 at a desired point on the parabola curve 60 and the line 64 connecting the desired point and the focus point 50 is equal to the angle formed by the tangent line 66 and an extension line 68 of the normal line 62 perpendicular to the reference line 54 and passing through the desired point. These angles are defined as θ in FIG. 6. In view of the above, considering that an incident wave comes from the focus position 50, hits, and is reflected on the parabola curve 60, the incident wave corresponds to the line 64, a point where the incident wave hits the parabola curve 60 corresponds to the desired point, and the reflected wave corresponds to the extension line 68 of the normal line 62. In the above, the desired point corresponds to the normal line lower end point 58.

Therefore, the reflected wave formed by the incident wave coming from the focus position 50 and hitting and thus being reflected by the parabola curve 60 is directed perpendicular to the reference line 54. This is holds for all points on the parabola curve 60. Therefore, regardless of the direction of an incident wave coming from the focus position 50, the reflected waves are all resultantly directed perpendicular to the reference line 54; that is, in parallel to the normal line. With this effect, the parabola curve 60 can be used as a curved line of the mirror surface of a collimation mirror.

As described above, when the basic outer shape of the fluid discharge channel 24 is formed based on the parabola curve 60, it is possible to have any flows flowing horizontally from the outside circumferential end of the sample holding plate 14 be directed in the y direction to be in parallel to one another without intersection. Here, note that the channel that extends from the cylindrical portion 22 of the enclosure 12 to the gas discharge unit 32 includes an inside wall of the outer shape of the fluid discharge channel 24 and the side wall of the protection ring 19 provided outside the sample-holding plate 14, and assume that these two wall surfaces are respectively referred to as a channel one-side wall surface and a channel other-side wall surface. Then, the parabola curve can be referred to as a channel one-side curved line as being a curved line for use for the channel one-side wall surface. Similarly, a curved line for use for the side wall of the protection ring 19, or the channel other-side wall surface, can be referred to as the channel other-side curved line. The channel other-side curved line is better defined in consideration of the channel one-side curved line as being a curved line opposite to the channel one-side curved line.

Figure 7:
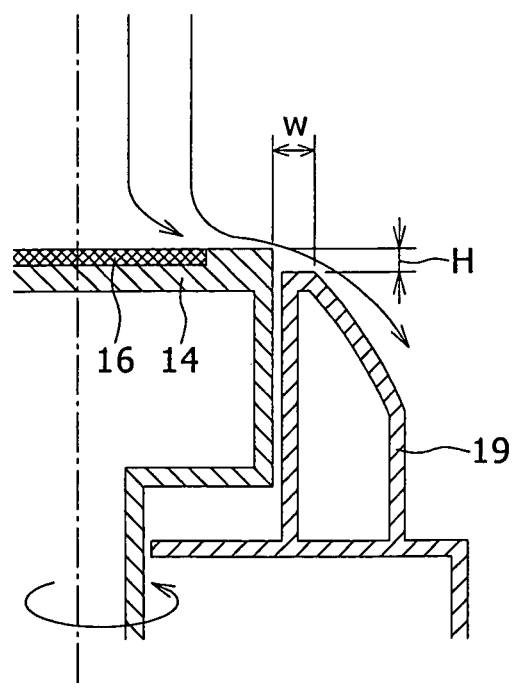
FIG. 7 is a diagram explaining a relationship between a sample-holding plate and a protection ring provided outside the sample-holding plate.

FIG. 7 is a diagram showing an area near the sample-holding plate 14 and the protection ring 19, in which the protection ring 19 corresponds to the outside member provided on the outside circumferential side of the sample-holding plate 14. The channel other-side curved line is a curved line defining the outer shape of the protection ring 19. In FIG. 7, a linear portion defining the top surface of the protection ring 19 and a curved portion moderately extending downward from the top surface together constitute the channel other-side curved line. As shown in FIG. 7, the protection ring 19 has a top surface positioned lower by a step H than the height position of the sample-holding plate 14. While the width of the step portion is defined as W, the smooth swollen curved line of the side wall that includes the linear portion having the width W and moderately extends downward from the top surface constitutes the channel other-side curved line.

The reason why the top surface of the protection ring 19 is positioned lower by the step H than the height position of the sample-holding plate 14, as described above, is to draw the used fluid 42 downward when having just come out from the sample-holding plate 14 so that the used fluid 42 can be readily directed downward. When the width W of the step portion of the protection ring 19 is excessive, the used fluid 42, although the flow direction thereof is changed after the used fluid 42 bumps against the stepped portion of the protection ring 19, proceeds flowing along the surface of the stepped portion and bumps against the wall surface of the channel one-side curved line. To address the above, the stepped portion is formed having an appropriately narrow width W, so that the bump can be avoided and that the used fluid 42 can be directed downward along the side wall of the protection ring 19 due to the fluid-drawing effect imparted to the used fluid 42 by the rotating lateral surface of the sample-holding plate 14 having the stepped portion H. For these reasons, preferably, the channel other-side curved line, which is the curved line of the side wall of the protection ring 19, is formed as a curved line moderately extending further downward, compared to the channel one-side curved line.

As described above, when the top surface of the protection ring 19 is positioned lower than the sample-holding plate 14 by the step H having a suitably narrow width W, the channel other-side curved line can be defined using a curved line extending downward from the top surface, or the stepped portion, with a curvature radius smaller than that of a parabola curve. With this arrangement, the used fluid can be led downward along the side wall of the protection ring 19, and a time at which the used fluid bumps against the wall surface of the channel one-side curved line can be delayed. Further, with the above, the flow speed of the used fluid bumping against the channel one-side curved line can be reduced, and the temperature of the used fluid bumping against the channel one-side curved line can be lowered. Therefore, it is possible to reduce deposition on the wall surface of the channel one-side curved line due to the used fluid 42.

Further, when the channel one-side curved line is defined using a parabola curve so that the flow line of the used fluid 42 can be directed downward, it is possible to reduce the possibility of occurrence of a backflow of the used fluid. Should a backflow occur for some reason, the angled portion 13 at the outlet can block the backflow. In order to effectively prevent a backflow, preferably, the outlet is not smooth, but rather shaped to have a definite angle, as shown in FIG. 4. One possibility of a backflow is a backflow from the gas discharge unit 32. However, when the used fluid 42 is rectified by the parabola curve or the like while flowing downward, such a flow can reduce the backflow from the gas discharge unit 32.

Figure 8:
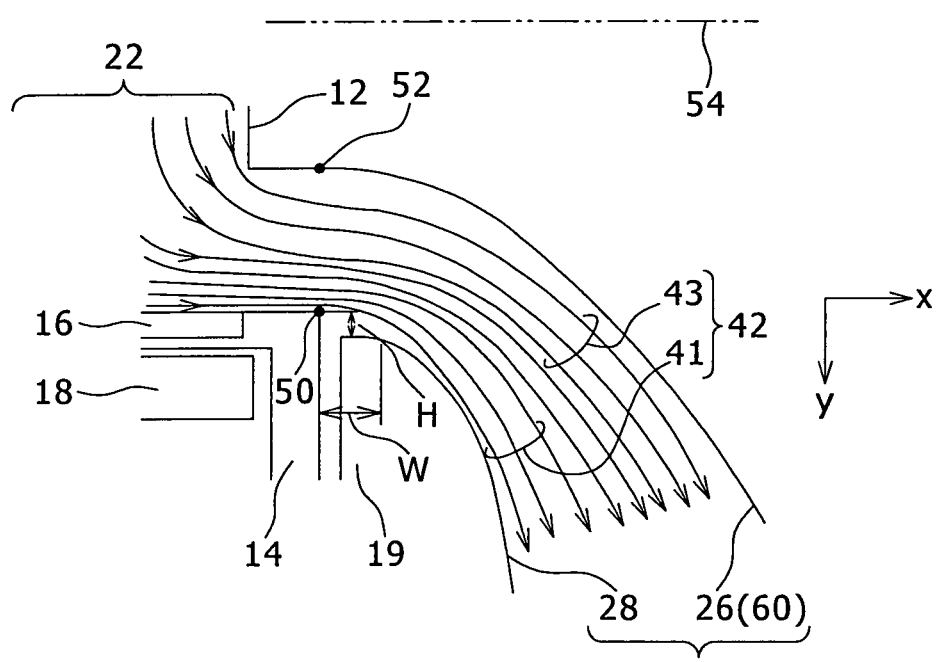
FIG. 8 is a diagram explaining an effect of the fluid discharge channel in an embodiment of the present invention.

FIG. 8 is a diagram explaining a result of application of the parabola curve 60, showing an xy cross sectional view with the end portion of the sample-holding plate 14 as the center. As shown in FIG. 8, the outlet is an opening located between the focus position 50, corresponding to the position of the upper end of the outmost circumference of the sample-holding plate 14, and the reference position 52 opposite to the focus position 50 along the y direction. The parabola curve 60 described with reference to FIG. 6 is used for a channel one-side curved line 26 with the reference position 52 as a start position. Note that although the parabola curve 60 is the optimum curve when it is assumed that the fluid is to fully reflected, in actuality, as the flow is not always fully reflected, any parabola analogous curve based on the parabola curve 60 can be employed depending on the condition of the flow.

The channel other-side curved line 28 opposite to the channel one-side curved line 26 is defined to include the top surface of the protection ring 19 provided having a step H relative to the sample-holding plate 14, as described with reference to FIG. 7, and having a smaller curvature radius than that of the parabola curve 60. Note that the width dimension, or the dimension of the step H along the radial direction, is set to a predetermined width dimension W.

The channel one-side curved line 26 constitutes the curved line, on the xy cross section, of the curved surface on the upper surface side of the annular fluid discharge channel 24 spreading like a skirt, as described with reference to FIG. 1. That is, a one-side channel surface in a circular symmetrical shape that is obtained by rotating the channel one-side curved line 26 around the central axis of the enclosure 12 constitutes the curved surface on the upper surface side of the annular fluid discharge channel 24. Similarly, the channel other-side curved line 28 constitutes the curved line, on the xy cross section, of the curved surface on the lower surface side of the annular fluid discharge channel 24 spreading like a skirt. In order to form the fluid discharge channel 24 as an annular channel surrounding the circumference of the sample-holding plate 14, a connection surface is provided for connecting the one-side channel surface and the other-side channel surface, so that these all together form the annular fluid discharge channel 24.

FIG. 8 schematically showing a flow of the used fluid 42 in the fluid discharge channel 24 defined as described above. As shown, a flow of the used fluid 42 includes a relatively fast flow 41 that is bent downward due to the effect of the step H of the protection ring 19 and flowing along the protection ring 19 and a relatively slow flow 43 that is flowing along the channel one-side channel 26. As described above, various flows having flowed on the surface of the substrate 16 flow in parallel to one another with no turbulence occurring except in an area near the upper end of the outlet. This can resultantly reduce the possibility that reaction product being attached on the inner wall of the fluid discharge channel 24.

Figure 9:
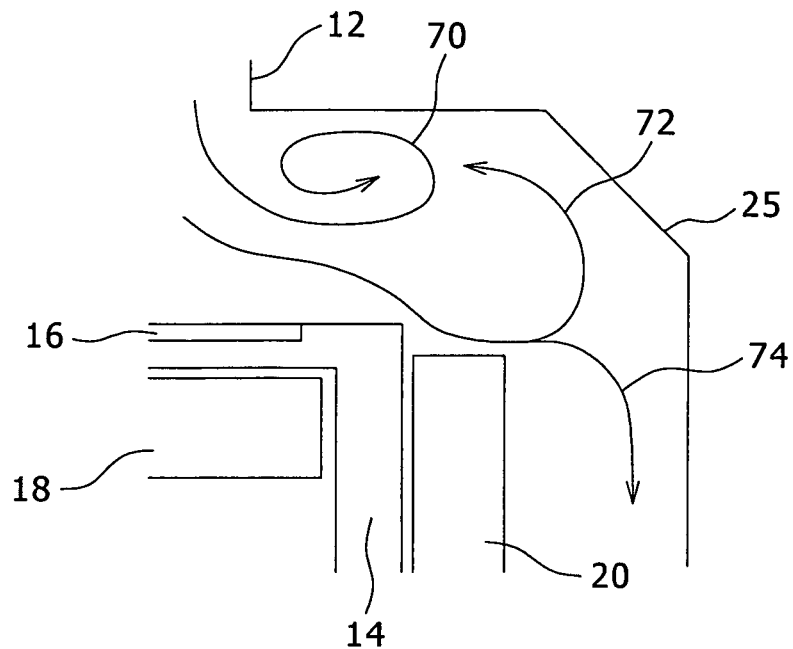
FIG. 9 is a diagram explaining a fluid discharge channel in a typical conventional surface treatment apparatus.

FIG. 9 is a diagram explaining flow turbulence caused in a fluid discharge channel 25 of a typical conventional surface treatment apparatus. As the fluid discharge channel 25 of a typical conventional surface treatment apparatus is a linear channel partially having a beveled wall rather than a streamlined channel such as is described with reference to FIG. 8, the used fluid flowing on a surface of the substrate 16 violently bumps against the beveled surface of the linear channel of the fluid discharge channel 25 to be divided into a backflow 72 returning to the upstream side and a discharge gas flow 74 flowing to the downstream side, in addition to the backflow 70 caused near the upper end of the outlet. Such a backflow 72 may join the backflow 70.

Figure 10:
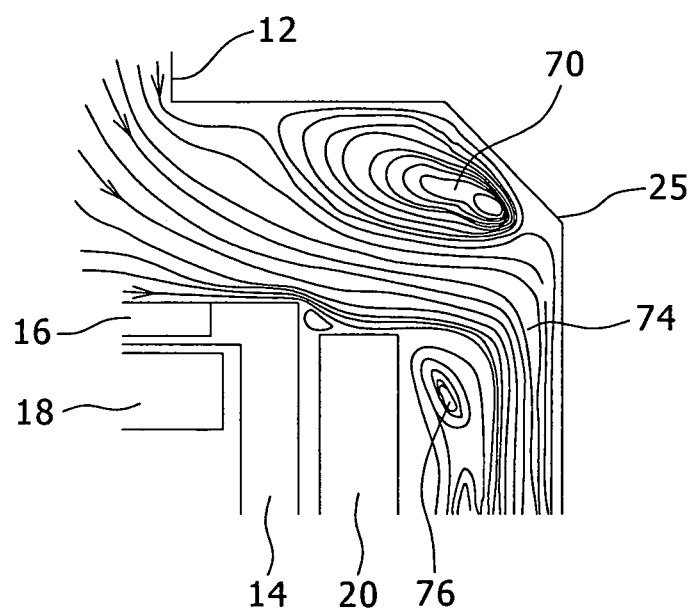
FIG. 10 is a diagram explaining an effect of the fluid discharge channel of the typical conventional surface treatment apparatus shown in FIG. 9.

FIG. 10 shows a result of simulation calculation of a flow of the used fluid in the conventional fluid discharge channel 25. As described with reference to FIG. 9, the backflow 70 occurring in a wider area near the upper end of the outlet, the discharge gas flow 74 resulting from a flow having violently bumped against the linear beveled surface of the fluid discharge channel 25 and thereby forcibly bent, and a backflow 76 caused on the discharge side are shown. Comparison between FIGS. 8 and 10 clearly shows that in the fluid discharge channel 24 employing the parabola curve 60, various flows flowing along the surface of the substrate 16 come to flow in parallel to one another so that the used fluid can be effectively prevented from bumping against the inside wall of the outlet channel and being disturbed, compared to the conventional fluid discharge channel 25.

INDUSTRIAL APPLICABILITY

A surface treatment apparatus according to the present invention can be used in surface treatment in which a material fluid such as suitable reaction gas or the like is supplied onto a substrate to form thereon a semiconductor layer, an insulating film, an electric conductive layer, or the like, or to etch or clean a surface thereof, or to form a coating member.

DESCRIPTION OF REFERENCE NUMERALS 10 surface treatment apparatus, 12 enclosure, 13 angled portion, 14 sample-holding plate, 16 substrate, 18 heater, 19 protection ring, 22 cylindrical portion, 24 fluid discharge channel, 25 (conventional) fluid discharge channel, 26 channel one-side curved line, 28 channel other-side curved line, 30 supply unit, 32 gas discharge unit, 34 rotary unit, 36 heating unit, 40 material fluid, 41, 43 flow, 42 used fluid, 50 focus position, 52 reference position, 54 reference line, 56 normal line upper end point, 58 normal line lower end point, 60 parabola curve, 62 normal line, 64 line (extended from a focus position), 66 tangent, 68 extension line, 70, 72, 76 backflow, 74 discharge gas flow.

The invention claimed is:

1. A surface treatment apparatus, comprising:
an enclosure constituting a circumferential wall;
a sample-holding plate provided inside the enclosure, for holding a sample;
a material fluid supply channel provided to the enclosure, for supplying a material fluid to the sample on the sample-holding plate; and
a fluid discharge channel provided on a lateral side of the sample-holding plate in the enclosure, for discharging to the outside the material fluid having applied surface treatment to the sample while flowing along a surface of the sample, as a used fluid, via an outlet formed on the lateral side of the sample-holding plate,
wherein
when
a directional axis perpendicular to a cross section of the outlet is defined as an x axis,
a desired directional axis orthogonal to the x axis is defined as a y axis,
a position of one of points where a circumferential end of the outlet intersects the y axis is defined as a focus position and also as a +a position of the y axis,
a position of the other of the points where the circumferential end of the outlet intersects the y axis, being symmetrically opposite to the focus position relative to the x axis, is defined as a reference position and also as a zero position of the y axis,
a reference line is defined in a −a position of the y axis, which is a position symmetrical to the focus position with the reference position in-between,
a point where a desired normal line in parallel to the y axis intersects the reference line is defined as a normal line upper end point, and
a point where the desired normal line intersects a desired line extending from the focus position is defined as a normal line lower end point,
the fluid discharge channel includes
a channel one-side curved line that is a parabola curved line that passes the reference position, wherein the parabola curved line is obtained as a trajectory of the normal line lower end point such that a length of the desired normal line between the normal line upper end point and the normal line lower end point is equal to a length of the desired line between the focus position and the normal line lower end point, or a parabola analogous curved line formed with the parabola curved line as a basic curved line, and
a channel other-side curved line opposite to the channel one-side curved line, and
a shape of the fluid discharge channel is formed based on the channel one-side curved line and the channel other-side curved line.

2. A The surface treatment apparatus, according to claim 1, further comprising:
a rotary mechanism for driving to rotate the sample-holding plate.

3. The surface treatment apparatus according to claim 2, wherein the fluid discharge channel has the outlet having a height dimension equal to a thickness dimension of a boundary layer flowing on the surface of the sample.

4. The surface treatment apparatus according to claim 2, wherein the fluid discharge channel has an angled shape in the outlet formed on the lateral side of the sample-holding plate.

5. The surface treatment apparatus according to claim 2, wherein
when the sample-holding plate additionally has an outside member provided on an outside circumference side thereof, the outside member constitutes the channel other-side curved line including a top surface having a predetermined width and positioned lower than a height position of the sample-holding plate by a step and a smooth swollen shape extending further downward from the top surface, and
the predetermined width is defined so narrow that a flow being bent by the step into a direction in which the step portion is provided is prevented from flowing along the step and bumping against an opposite fluid discharge channel.

6. The surface treatment apparatus according to claim 2, wherein
the enclosure has a cylindrical shape having a central axis in parallel to the y axis, and
the fluid discharge channel includes
a one-side channel surface in a circular symmetrical shape formed by rotating the channel one-side curved line around the central axis of the enclosure,
an other-side channel surface in a circular symmetrical shape formed by rotating the channel other-side curved line around the central axis of the enclosure, and
a connection surface for connecting the one-side channel surface and the other-side channel surface.

7. The surface treatment apparatus according to claim 1, wherein the fluid discharge channel has the outlet having a height dimension equal to a thickness dimension of a boundary layer flowing on the surface of the sample.

8. The surface treatment apparatus according to claim 1, wherein the fluid discharge channel has an angled shape in the outlet formed on the lateral side of the sample-holding plate.

9. The surface treatment apparatus according to claim 1, wherein
when the sample-holding plate additionally has an outside member provided on an outside circumference side thereof, the outside member constitutes the channel other-side curved line including a top surface having a predetermined width and positioned lower than a height position of the sample-holding plate by a step and a smooth swollen shape extending further downward from the top surface, and
the predetermined width is defined so narrow that a flow being bent by the step into a direction in which the step portion is provided is prevented from flowing along the step and bumping against an opposite fluid discharge channel.

* * * * *